April 29, 1969 B. REIDEL 3,441,723

COUNTING CODER

Filed May 14, 1965

INVENTOR

BERTHOLD REIDEL

BY [signature]

ATTORNEY

United States Patent Office 3,441,723
Patented Apr. 29, 1969

3,441,723
COUNTING CODER
Berthold Reidel, Stuttgart, Germany, assignor to International Standard Electric Corporation, New York, N.Y., a corporation of Delaware
Filed May 14, 1965, Ser. No. 455,783
Claims priority, application Germany, June 3, 1964, St 22,203, 22,204
Int. Cl. G06f 5/00
U.S. Cl. 235—154 15 Claims

ABSTRACT OF THE DISCLOSURE

A reversible binary counter is reset to provide a binary "one" from its most significant stage and a binary "zero" from its other stages and the driving pulses for the counter are coupled to a stage of greater significance than the least significant stage to reduce the counting frequency. The instantaneous amplitude of an analog signal is compared with the decoded output of the counter. The counting is stopped when the decoded output exceeds the analog amplitude with an adjustment being made to the count of the counter by controlling the binary condition of the least significant stage if the decoded output equals or is greater than a single quantized step to produce the final count or binary code. The direction of the count of the counter is controlled by the output of an analog polarity detector.

This invention relates to coders for employment in pulse code modulation systems and more particularly, to coders of the counting type.

An object of this invention is to provide a counting coder which enables the reduction in the counting frequency without reducing the number of quantized steps or amplitude levels capable of being coded.

Another object of this invention is the provision of a counting coder wherein the counting frequency can be maintained and the number of quantized steps or amplitude levels can be increased.

A feature of this invention is the provision of a counting coder comprising means to store the instantaneous amplitude of an analog signal, a pulse generator, a binary counter having a plurality of stages weighted successively from the least significant stage to the most significant stage, second means to couple the pulses of the pulse generator to a given one of the counter stages of higher weight than the least significant weight stage for counting the pulses of the pulse generator and produce parallel digital outputs from all the counting stages, each of the parallel digital outputs representing different quantized amplitude levels, and third means coupled to the output of the counter stages and the means to store to stop the counting of the counter when the counter produces a quantized amplitude level output greater than the stored instantaneous amplitude of the analog signal.

Another feature of this invention includes a counting coder, as described hereinabove, further including a fourth means coupled to the means to store and the output of the counter stages to compare the quantized amplitude level output and the stored instantaneous amplitude of the analog signal to produce a control signal when the difference between the quantized amplitude level output and the stored instantaneous amplitude of the analog signal exceeds a predetermined amount, and fifth means to couple the control signal to the least significant stage to adjust the count of the counter.

A further feature of this invention includes a counting coder, as described hereinabove, further including the employment of a reversible binary counter as the counter of the counting coder, means to reset the reversible binary counter to a quantized amplitude level intermediate the lowest and highest quantized amplitude levels capable of being generated by the reversible binary counter, means coupled to the means to store to determine the polarity of the stored instantaneous amplitude of the analog signal, and means coupled to the means to determine to control the coupling of the pulses of the pulse generator to the given one of the counter stages to determine the direction of counting of the reversible binary counter.

The above-mentioned and other features and objects of this invention will become more apparent by reference to the following description taken in conjunction with the accompanying drawings in which.

Figure 1:
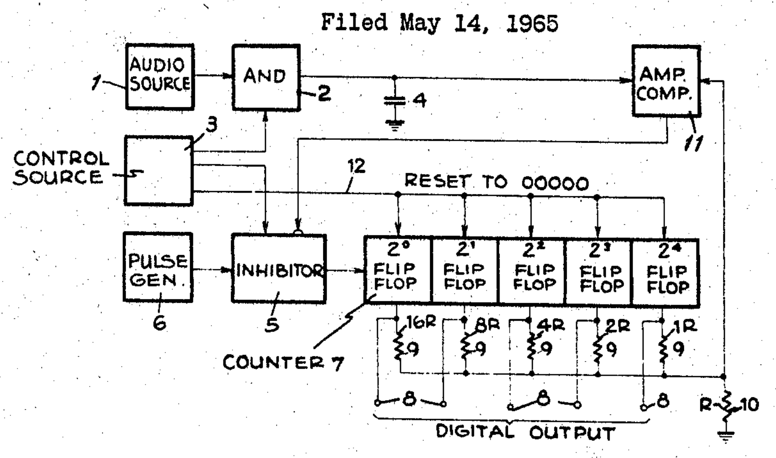
FIG. 1 (PRIOR ART)
FIG. 1 is a schematic diagram in block form of one type of counting coder found in the prior art.
Figure 2:
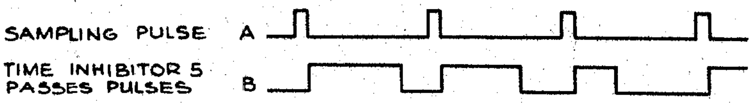
FIG. 2 is a timing diagram illustrating pictorially the operation of the binary counter of the prior art as well as the binary counter coder of this invention.

Referring to FIG. 1, there is illustrated therein for purposes of explanation a known counting coder for coding analog signals into simple binary code having 32 amplitude levels or quantized steps. The analog signal in the form of audio source 1 is coupled to a switch in the form of AND circuit 2 which, under the control of the control source 3, is enabled to pass a sample of the instantaneous amplitude of the analog signal from source 1. The instantaneous amplitude at the output of AND circuit 2 is stored in capacitor 4. The enabling or actuating time for the AND circuit 2 is illustrated in curve A, FIG. 2.

At the end of the sampling pulse, the switch in the form of an inhibitor 5 is enabled under the control of control source 3 to connect the pulse generator 6 to the least significant stage of binary counter 7. Counter 7 is advanced by the pulses from generator 6 and produces at the output terminals 8 of each stage of the binary counter a parallel digital code output representing successively different quantized amplitude levels.

The weighted resistors 9 coupled to the output of each of the counter stages and in common to resistor 10 generate an analog signal corresponding to the quantized amplitude levels generated by the stages of counter 7. These weighted resistors 9 and the resistor 10 function as a decoder or digital-to-analog converter. The voltage produced across resistor 10 is coupled to amplitude comparator 11 which has its other input coupled to storage capacitor 4. Amplitude comparator 11 is of the type that functions to produce no output when the voltage across resistor 10 is less than the voltage stored in capacitor 4 and, in turn, will produce an output when the voltage across resistor 10 exceeds the voltage stored in capacitor 4. This output produced by comparator 11 upon the decoded output of counter 7 exceeding the stored voltage of capacitor 4 is coupled to the inhibit terminal of inhibitor 5 and inhibits or stops the coupling of the pulses of generator 6 to counter 7 thereby interrupting the counting of counter 7. When the counting of counter 7 has been stopped, the binary value of the instantaneous amplitude of the analog signal stored in capacitor 4 is derived from terminals 8. Depending upon the value of the instantaneous amplitude of the analog signal stored in capacitor 4 more or less pulses will be applied from generator 6 to counter 7. Thus, there is a variable number of pulses coupled to counter 7 determined by the value of the instantaneous amplitude of the analog signal stored in capacitor 4 and, as a result, a variable length of time which inhibitor 5 will pass pulses from generator 6 to counter 7. This is illustrated in curve B, FIG. 2 wherein it is indicated that varying widths or lengths of time of operation of inhibitor 5 correspond to the value of the instantaneous amplitude of the analog signal stored in capacitor 4 by the varying position of the right-hand edge of the pulses of curve B, FIG. 2.

Before the next sample in a simplex system is coded, or before the next channel in a multichannel has its instantaneous amplitude coded, the counter 7 must be restored or reset to zero. This resetting is accomplished under control of control source 3 over conductor 12.

Figure 3:
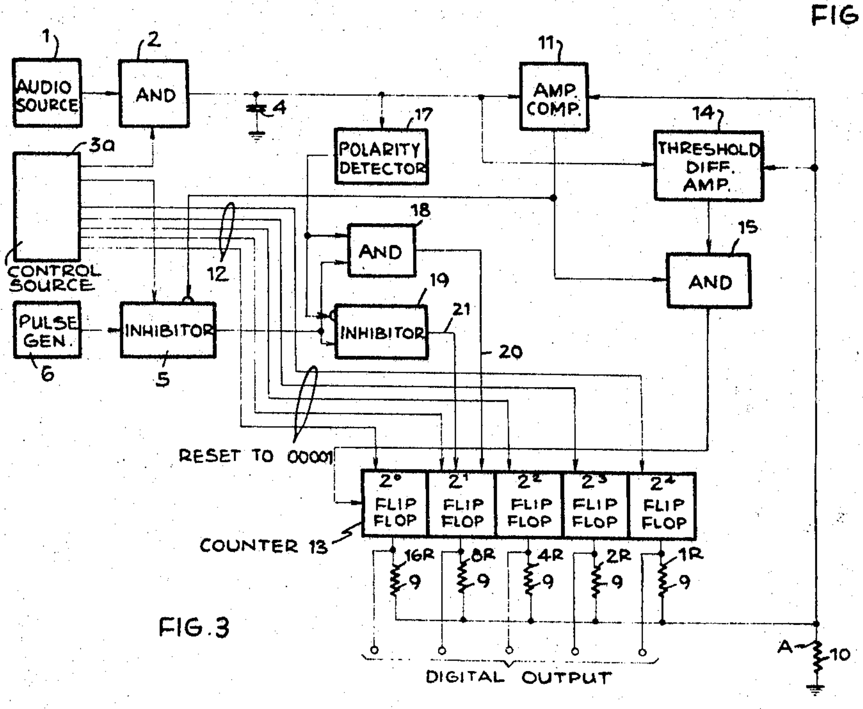
FIG. 3 is a schematic diagram in block form of an embodiment of a counting coder following the principles of this invention.

Referring to FIG. 3, there is illustrated therein an embodiment of the counting coder in accordance with the principles of this invention. Components of FIG. 3 which correspond to the components of FIG. 1 have applied thereto the same reference characters as employed in FIG. 1.

Again, the counting coder is for purposes of explanation of the type capable of coding 32 quantized amplitude levels. The analog signal from source 1 is sampled, as in the embodiment of FIG. 1, by the AND circuit 2 which is enabled momentarily by the sampling pulse from control source 3*a* to provide at the output thereof an instantaneous amplitude of the analog signal from source 1 for storage in capacitor 4. At the end of the sampling period control source 3*a* produces an enabling pulse for inhibitor 5 which will couple the pulses of pulse generator 6 to a stage of counter 13 having a weight greater than the weight of the least significant stage of the counter 13. As indicated in the drawing of FIG. 3, pulse generator 6 has its pulses passed by inhibitor 5 through a means to be explained hereinbelow to the second stage of counter 13.

As counter 13 counts the pulses from the output of pulse generator 6 and sequentially produces the various quantized levels, the decoder including weighted resistors 9 and resistor 10 produce an analog signal or output voltage corresponding to the generated quantized amplitude levels which are coupled to amplitude comparator 11 to have the amplitude thereof compared with the amplitude of the sample stored in capacitor 4. As soon as the decoded output of counter 13 exceeds the value of the instantaneous amplitude stored in capacitor 4, comparator 11 produces an output which is coupled to the inhibit terminal of inhibitor 5 to stop the passage of the pulses from generator 6 to counter 13.

As will be apparent, the description thus far is similar to that presented hereinabove with respect to FIG. 1 except that in accordance with the principles of this invention the pulses from generator 6 are coupled to a stage of counter 13 which has a greater weight than the least significant weight stage of counter 13. For purposes of explanation, this greater weight stage is illustrated to be the second stage of counter 13. This connection enables a reduction by one half of the frequency of the pulses at the output of generator 6 and, hence, the counting frequency of counter 13.

To assure that counter 13 provides a digital output therefrom that does not exceed the value of one quantizing step of the amplitude of the samples stored in capacitor 4, a threshold differential amplifier 14 is coupled to storage capacitor 4 and resistor 10 of the decoder coupled to the output stages of counter 13. The operation of the threshold differential amplifier 14 is to produce an output therefrom when the voltage across resistor 10 exceeds the voltage stored in capacitor 4 by an amount equal to more than the amplitude between adjacent quantized amplitude levels. If such an output is produced it is coupled to AND circuit 15 which is enabled by the output of comparator 11 and passes an output therefrom to the least significant stage of counter 13 (stage $2^0$) to adjust the count of counter 13 to bring the count to the proper quantized level so that the difference between the voltage produced across resistor 10 and the voltage stored in capacitor 4 is less than the voltage between adjacent quantized levels.

As in the arrangement of FIG. 1, the counter 13 must be reset after the coding of each sample of a single audio source in a simplex system, or after each sample in a multichannel system, by reset pulses generated in source 3*a* and coupled along the reset conductors 16 to each of the stages of counter 13 to return the counter to the zero level.

The arrangement described hereinabove with reference to FIG. 3 may cause a further reduction in the counter frequency by employing a reversible binary counter for counter 13 and employing the reset conductor 16 to set counter 13 to a value which is intermediate both extremes to which the counter 13 is capable of counting. Thus, the reset conductor 16 coupled to the stages of the reversible binary counter 13 would reset the stages of counter 13 to quantized amplitude level sixteen which would cause stage $2^4$ to be reset to provide a "one" output and the remaining stages of counter 13 to be reset to provide a "zero" output.

With this type of counter being employed for counter 13, it is necessary to command counter 13 to count in one direction or the other, namely, in a forward direction or backward direction. To accomplish this a polarity detector 17 is coupled to storage capacitor 4 which determines the polarity of the signal stored on capacitor 4. Let it be assumed that detector 17 will produce a positive output when the polarity of the voltage stored in capacitor 4 is positive and that no output will be present from detector 17 when the voltage stored in capacitor 4 is negative. Under these conditions, which is one of many ways of controlling the direction of counting of counter 13, the output from detector 17 will enable the AND circuit 18 and inhibit inhibitor 19 so that the pulses from generator 6 as coupled through AND gate 17 and along conductor 20 to cause a forward count. If, on the other hand there is no output from detector 17, AND gate 18 will not be enabled and inhibitor 19 will be placed in a condition to conduct the pulses from generator 6 to conductor 21 to cause counter 13 to count backward.

From the foregoing, it is apparent that when counter 13 is activated by the pulses from generator 6 coupled to the second stage of this counter the counting frequency is reduced by one half. In addition, by employing a reversible counter for counter 13 and controlling counter 13 from the intermediate quantized level between the extremities of the possible count or quantized levels capable of being generated by this counter reduces by still another one half the counting frequency.

The resultant reduction in counting frequency achieved by employing the principles of this invention can be demonstrated by the following example. For this example it is assumed that the counter can code 128 quantized amplitude levels, that an 8 kc. sampling rate is employed and that the counter is employed in a 24 channel multichannel system. Using the prior art counting coder of FIG. 1, the counting frequency would be $$8\times24\times128=24.576 \text{ mc./s.}$$

On the other hand, employing a counter following the principles of this invention where the coarse counting is accomplished by feeding pulses from generator 6 to counting stage $2^1$, the maximum counting frequency, taking into account possible correction with counting stage $2^0$, is $$8\times24\left(\frac{128}{4}+1\right)=6.336 \text{ mc./s.}$$

The selection of the counting stage to which the pulses of pulse generator 6 are connected for coarse counting is determined by the amplitude distribution of the signal to be coded and may be any other stage in counter 13 other than the least significant weight stage.

I claim:

1. A counting coder comprising:

a source of analog signal;

first means coupled to said source to store the instantaneous amplitude of said analog signal;

a pulse generator;

a reversible binary counter having a plurality of stages weighted successively from the least significant stage to the most significant stage;

second means to couple the pulses of said generator to a given one of said counter stages of higher weight than said least significant weight stage for counting said pulses and produce parallel digital outputs from all of said stages, each of said parallel digital outputs representing different quantized amplitude levels;

third means coupled to the output of said counter stages and said first means to stop the counting of said counter when said counter produces a quantized amplitude level output greater than said amplitude of said analog signal stored in said first means; and means coupled to said counter to reset said counter stages to provide a binary "one" from said most significant stage and a binary "zero" from all others of said counter stages.

2. A coder according to claim 1, wherein said third means includes:

a decoder coupled to the output of said stages; and an amplitude comparator coupled to said decoder and said first means to produce a signal when the amplitude of the output signal from said decoder is greater than said amplitude of said stored analog signal to stop the counting of said counter.

3. A coder according to claim 1, further including:

fourth means coupled to said first means and said output of said counter stages to compare said quantized amplitude level output and said amplitude of said stored analog signal to produce a control signal when the difference between said quantized amplitude level output and said amplitude of said stored analog signal exceeds a predetermined amount; and fifth means to couple said control signal to said least significant stage to adjust the count of said counter.

4. A coder according to claim 3, wherein said predetermined amount is the amplitude difference between adjacent quantized amplitude levels.

5. A coder according to claim 3, wherein said fourth means includes:

a threshold differential amplifier; and said fifth means includes a coincidence circuit having one input coupled to said third means, the other input coupled to said differential amplifier, and the output coupled to said least significant stage.

6. A coder according to claim 3, wherein said fifth means includes:

a coincidence circuit having one input coupled to said third means, the other input coupled to said fourth means, and the output coupled to said least significant stage.

7. A counting coder comprising:

a source of analog signal;

first means coupled to said source to store the instantaneous amplitude of said analog signal;

a pulse generator;

a binary counter having a plurality of stages weighted successively from the least significant stage to the most significant stage;

second means to couple the pulses of said generator to a given one of said counter stages of higher weight than said least significant weight stage for counting said pulses and produce parallel digital outputs from all of said stages, each of said parallel digital outputs representing different quantized amplitude levels;

third means coupled to the output of said counter stages and said first means to stop the counting of said counter when said counter produces a quantized amplitude level output greater than said amplitude of said analog signal stored in said first means;

fourth means coupled to said first means and said output of said counter stages to compare said quantized amplitude level output and said amplitude of said stored analog signal to produce a control signal when the difference between said quantized amplitude level output and said amplitude of said stored analog signal exceeds a predetermined amount; and fifth means to couple said control signal to said least significant stage to adjust the count of said counter;

said third means including:

a decoder coupled to the output of said stages, and an amplitude comparator coupled to said decoder;

and said first means to produce a signal when the amplitude of the output signal of said decoder is greater than said amplitude of said stored analog signal to stop the counting of said counter;

said fourth means including:

a threshold differential amplifier coupled to said first means and the output of said decoder to produce said control signal; and said fifth means including:

a coincidence circuit having one input coupled to the output of said amplitude comparator, the other input coupled to said differential amplifier, and the output coupled to said least significant stage.

8. A counting coder comprising:

a source of analog signal;

first means coupled to said source to store the instantaneous amplitude of said analog signal;

a pulse generator;

a reversible binary counter having a plurality of stages weighted successively from the least significant stage to the most significant stage;

second means to couple the pulses of said generator to a given one of said counter stages of higher weight than said least significant weight stage for counting said pulses and produce parallel digital outputs from all of said stages, each of said parallel digital outputs representing different quantized amplitude levels; and third means coupled to the output of said counter stages and said first means to stop the counting of said counter when said counter produces a quantized amplitude level output greater than said amplitude of said analog signal stored in said first means;

said second means including:

sixth means to determine the polarity of said stored analog signal, and seventh means coupled to said sixth means to control the coupling of the pulses of said generator to said given one of said counter stages to determine the direction of counting of said reversible binary counter.

9. A counting coder comprising:

a source of analog signal;

first means coupled to said source to store the instantaneous amplitude of said analog signal;

a pulse generator;

a reversible binary counter having a plurality of stages weighted successively from the least significant stage to the most significant stage;

second means to couple the pulses of said generator to a given one of said counter stages of higher weight than said least significant weight stage for counting said pulses and produce parallel digital outputs from all of said stages, each of said parallel digital outputs representing different quantized amplitude levels;

third means coupled to the output of said counter stages and said first means to stop the counting of said counter when said counter produces a quantized amplitude level output greater than said amplitude of said analog signal stored in said first means; and means to reset said counter to a quantized amplitude level intermediate the lowest and highest quantized amplitude levels capable of being generated by said counter;

said second means including:

sixth means to determine the polarity of said stored analog signal, and seventh means coupled to said sixth means to control the coupling of the pulses of said generator to said given one of said counter stages to determine the direction of counting of said reversible binary counter.

10. A coder according to claim 9, wherein said third means includes:

a decoder coupled to the output of said stages; and an amplitude comparator coupled to said decoder and said first means to produce a signal when the amplitude of the output signal from said decoder is greater than said amplitude of said stored analog signal to stop the counting of said counter.

11. A coder according to claim 9, further including:

fourth means coupled to said first means and said output of said counter stages to compare said quantized amplitude level output and said amplitude of said stored analog signal to produce a control signal when the difference between said quantized amplitude level output and said amplitude of said stored analog signal exceeds a predetermined amount; and fifth means to couple said control signal to said least significant stage to adjust the count of said counter.

12. A coder according to claim 11, wherein said predetermined amount is the amplitude difference between adjacent quantized amplitude levels.

13. A coder according to claim 11, wherein said fourth means includes:

a threshold differential amplifier; and said fifth means includes:

a coincidence circuit having one input coupled to said third means, the other input coupled to said differential amplifier, and the output coupled to said least significant stage.

14. A coder according to claim 11, wherein said fifth means includes:

a coincidence circuit having one input coupled to said third means, the other input coupled to said fourth means, and the output coupled to said least significant stage.

15. A coder according to claim 11, wherein said third means includes:

a decoder coupled to the output of said stages, and an amplitude comparator coupled to said decoder and said first means to produce a signal when the amplitude of the output signal of said decoder is greater than said amplitude of said stored analog signal to stop the counting of said counter;

said fourth means includes:

a threshold differential amplifier coupled to said first means and the output of said decoder to produce said control signal; and said fifth means includes:

a coincidence circuit having one input coupled to the output of said amplitude comparator, the other input coupled to said differential amplifier, and the output coupled to said least significant stage.

References Cited

UNITED STATES PATENTS

| | | | |
|---|---|---|---|
| 2,568,724 | 9/1951 | Earp et al. | 340—347 |
| 2,801,281 | 7/1957 | Oliver et al. | 340—347 |
| 3,298,019 | 1/1967 | Nossen | 335—92 |

MAYNARD R. WILBUR, *Primary Examiner.*

JEREMIAH GLASSMAN, *Assistant Examiner.*

U.S. Cl. X.R.

340—168